United States Patent
Schwartzkopf et al.

(10) Patent No.: US 6,326,130 B1
(45) Date of Patent: Dec. 4, 2001

(54) PHOTORESIST STRIPPERS CONTAINING REDUCING AGENTS TO REDUCE METAL CORROSION

(75) Inventors: George Schwartzkopf, Franklin Township, NJ (US); Geetha Surendran, Bronx, NY (US)

(73) Assignee: Mallinckrodt Baker, Inc., St. Louis, MO (US)

( * ) Notice: Subject to any disclaimer, the term of this patent is extended or adjusted under 35 U.S.C. 154(b) by 0 days.

(21) Appl. No.: 08/133,680

(22) Filed: Oct. 7, 1993

(51) Int. Cl.$^7$ .................................................... G03C 5/00
(52) U.S. Cl. ............................................ 430/329; 430/256
(58) Field of Search ................................ 430/329, 325, 430/326, 311, 256, 260

(56) References Cited

U.S. PATENT DOCUMENTS

| | | | |
|---|---|---|---|
| 4,346,125 | 8/1982 | Kinsbron et al. | 427/96 |
| 4,944,893 | 7/1990 | Tanaka et al. | 252/171 |
| 5,279,771 | * 1/1994 | Lee | 252/548 |
| 5,308,745 | * 5/1994 | Schwartzkopf | 430/329 |
| 5,310,428 | * 5/1994 | Bhatt et al. | 134/2 |

FOREIGN PATENT DOCUMENTS

0188548 * 4/1989 (JP) .
5-45894 2/1993 (JP) ............................. H01L/21/30

OTHER PUBLICATIONS

Research Disclosure Jan. 1991 (32169), "Organic Solvent for Cleaning Cost Metal Direct Access Storage Device (DASD) Components".*
Chemical Abst. 98:26394e of Fr. Pat. 2455076 (1980).
Chemical Abst. 98:26395f of Fr. Pat. 2455075 (1980).
Chemical Abst. 104:120041b of JPN Kokai 60–210842 (1985).
Chemical Abst. 111:123853y of JPN Kokai 01–88548 (1989).

* cited by examiner

*Primary Examiner*—Laura Weiner
(74) *Attorney, Agent, or Firm*—Rothwell, Figg, Ernst & Manbeck

(57) ABSTRACT

Alkaline photoresist stripping compositions containing reducing agent to reduce or inhibit metal corrosion. Reducing agents include compounds containing reactive multiple bonds, hydrazine and derivatives thereof, oximes, hydroquinone, pyrogallol, gallic acid and esters thereof, tocopherol, 6-hydroxy-2,5,7,8-tetramethylchroman-2-carboxylic acid, BHT, BHA, 2,6-di-tert-butyl-4-hydroxymethyl-phenol, thiols, salicylaldehyde, 4-hydroxybenzaldehyde and glycol aldehyde dialkylacetals.

2 Claims, No Drawings

PHOTORESIST STRIPPERS CONTAINING REDUCING AGENTS TO REDUCE METAL CORROSION

FIELD OF THE INVENTION

This invention relates to alkaline photoresist stripping compositions containing reducing agents and the use of such stripping compositions to reduce or inhibit metal corrosion and/or metal loss when stripping photoresists from substrates containing metals such as tungsten and/or copper and its alloys with aluminum.

BACKGROUND OF THE INVENTION

An integral part of microelectronic fabrication is the use of photoresists to transfer an image from a mask or reticle to the desired substrate circuit layer. After the desired image transfer has been achieved, the photoresist is removed, that is, stripped from the substrate before proceeding to some subsequent process step. Starting around 1980, amides and mixtures of amides with various co-solvents have routinely been used for this stripping step, see for example Ward et al., U.S. Pat. Nos. 4,395,479; 4,428,871 and 4,401,748.

Depending on the type of processing that is performed while the photoresist is in place on the substrate, the photoresist polymer may be cross-linked or hardened to the extent that amide-based solvents will no longer effectively strip the photoresist. Starting around 1985, the use of amide mixtures containing additional alkaline components, such as organic amines, (see Johnson U.S. Pat. No. 4,592,787; Merrem U.S. Pat. No. 4,765,844; Sizensky U.S. Pat. No. 4,617,251; Turner WO 87/05314 and Thomas et al. U.S. Pat. No. 4,791,043) or quaternary ammonium hydroxides (see Steppan et al. U.S. Pat. No. 4,776,892; Haq U.S. Pat. No. 4,744,834; Martin WO 88/05813) was introduced to facilitate the removal of such hardened photoresists.

The use of these alkaline components in strippers on microcircuits containing metals, particularly tungsten or copper and its alloys with aluminum, can lead to metal loss. Various types of metal corrosion, such as for example corrosion whiskers, pitting and notching of metal lines, have been observed during the use of these alkaline strippers. In the case of tungsten and copper corrosion can occur in the heated dry organic stripping composition mixtures with dissolved oxygen providing the cathodic reaction.

It would therefore be most desirable to be able to provide alkaline-containing photoresist stripping compositions suitable for stripping cross-linked or hardened photoresist polymer from substrates containing metal in which metal corrosion and/or metal loss is reduced or inhibited. A further object of this invention is to provide a method of stripping cross-linked or hardened photoresist from a metal-containing substrate using an alkaline-containing photoresist stripping composition containing an agent to reduce or inhibit such metal corrosion or metal loss.

BRIEF SUMMARY OF THE INVENTION

It has now been discovered that the inclusion of certain reducing agents in alkaline-containing photoresist stripping compositions produces photoresist stripping compositions that reduce or inhibit metal corrosion and/or metal loss when such photoresist stripping compositions are employed to remove cross-linked or hardened photoresist from substrates containing metal. Reducing agents suitable for use in alkaline-containing photoresist stripping compositions of this invention are the following: ascorbic acid, butyne diols, unsaturated ketones, uric acid, tetramisole, hydrazines and its derivatives including carbazates, oximes, hydroquinone, pyrogallol, gallic acid, 2,4,5-trihydroxybutyrophenone, tocopherol, 6-hydroxy-2,5,7,8-tetramethylchroman-2-carboxylic acid, butylatedhydroxytoluene (BHT), butylatedhydroxyanisole (BHA), 2,6-di-tert-butyl-4-hydroxymethylphenol, thiols, salicylaldehyde, 4-hydroxybenzaldehyde and glycol aldehyde dialkyl acetals and mixtures thereof. The amount of reducing agent employed in the photoresist stripping compositions of this invention is any amount effective to reduce or inhibit metal corrosion or metal loss and will generally be an amount within the range of from about 0.1 to about 10% by weight based upon the total weight of the photoresist stripping composition.

DETAILED DESCRIPTION OF THE INVENTION

The improved metal corrosion resistant photoresist stripping compositions of this invention comprise an organic solvent system, alkaline components and at least one of the suitable reducing agents. The organic solvent system employed in the photoresist stripping compositions of this invention is generally one having a solubility parameter of from about 8 to about 15 obtained by taking the square root of the sum of the squares of the three Hansen solubility parameters (dispersive, polar and hydrogen bonding). The solvent system may comprise any of a number of individual solvents or a mixture of several different solvents. As examples of such solvents there may be mentioned, various pyrrolidinone compounds such as 2-pyrroli-dinone, 1-methyl-2-pyrrolidinone, 1-ethyl-2-pyrrolidinone, 1-propyl-2-pyrrolidinone, 1-hydroxyethyl-2-pyrrolidinone, 1-hydroxypropyl-2-pyrrolidinone, N-cyclohexylpyrrolidinone, and the like, tri- or diethylene glycol monoalkyl ethers such as those of the formula

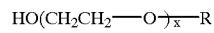

$$HO(CH_2CH_2-O)_x-R$$

where R is an alkyl radical of from 1 to 4 carbon atoms and x is 2 or 3, compounds containing sulfur oxides such as dialkyl sulfones of the formula

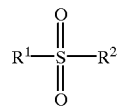

where $R^1$ and $R^2$ are alkyl of 1 to 4 carbon atoms, dimethyl sulfoxide (DMSO), tetrahydrothiophene-1,1-dioxide compounds of the formula

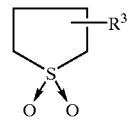

wherein $R^3$ is hydrogen, methyl or ethyl, such as sulfolane, methyl sulfolane and ethyl sulfolane, as well as polyethylene glycols, dimethylacetamide or dimethylformamide. The solvent system portion of the stripper compositions of this invention will generally comprise from about 50% to about 98% by weight of the composition, preferably about 70% to about 90% by weight.

Alkaline stripper components that may be used in this invention also cover a wide range of structural types. Their dissociation constants, expressed as pKa values, range from about 9 to 11 for the beta-oxygen or -nitrogen substituted amines to 8.3 for the secondary amine, morpholine and hydroxylamines and hydroxylamine derivatives of somewhat lower pKa values. Among the alkaline components that may be used there may be mentioned, nucleophilic amines, preferably for example, 1-amino-2-propanol, 1-amino-3-propanol, 2-(2-aminoethoxy)ethanol, 2-aminoethanol, 2-(2-aminoethylamino)ethanol, 2-(2-aminoethylamino) ethylamine, 1-(2-aminoethylpiperazine), and the like. More important than the actual pKa value of an amine is its nucleophilicity which should be high. The amount of amine component employed in the stripping compositions of this invention is from about 1% to about 50%, preferably about 10% to about 30% by weight of the composition.

Reducing agents effective as oxygen scavengers useful as the reducing agents in the improved photoresist compositions of this invention are the following:

compounds containing reactive double bonds, that is, ascorbic acid, uric acid, butyne diols, unsaturated ketones such as cyclohexenylacetone and 3-nonene-2-one, and tetramisole;

hydrazine and its derivatives, that is, compounds of the formula $R^4$—NH—$NH^2$ where $R^4$ is hydrogen or an organic radical, preferably a hydrogen, a formyl radical, an alkyl radical, an oxycarbonyl radical, a hydroxyalkyl radical, an alkylcarboxy radical or an aryl radical, for example, a phenyl radical;

oximes;

readily oxidized aromatic compounds and oxidation inhibitors, that is, hydroquinone, pyrogallol, gallic acid and alkyl esters thereof, tocopherol, 6-hydroxy-2,5,7,8-tetramethylchroman-2-carboxylic acid, butylatedhydroxytoluene, butylatedhydroxyanisole, and 2,6-di-tert-butyl-4-hydroxymethylphenol;

thiols of the formula $R^5SH$ where $R^5$ is an organic radical such as a heterocylic radical, carboxyaryl radical, a dicarboxyalkyl radical, an amino substituted carboxyalkyl radical or a radical of the formula

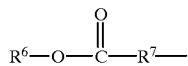

where $R^6$ and $R^7$ are alkyl radicals; and aldehydes and derivatives thereof, that is salicylaldehyde, 4-hydroxybenzaldehyde and glycol aldehyde dialkyl acetals, particularly glycol aldehyde diethyl acetal. Alkyl in the aforementioned reducing agents will generally be alkyl of 1 to about 12 carbon atoms, preferably alkyl of 1 to 6 carbon atoms and more preferably alkyl of 1 to 4 carbon atoms.

Especially preferred as reducing agents for use in the stripping compositions of this invention are ascorbic acid, uric acid, 2-butyne-1,4-diol, 1-cyclohexenyl acetone, 3-nonene-2-one, 2,3,5,6-tetrahydro-6-phenylimidazo[2,1-b]thiazole and the hydrochloride thereof, hydrazine, p-toluenesulfonylhydrazide, formic hydrazide, maleic hydrazide, hydrazine hydrate, hydroxyethyl hydrazine, phenyl hydrazine, t-butyl carbazate, ethyl carbazate, salicylaldoxime, acetone oxime, pyrogallol, gallic acid, 2,4, 5-trihydroxybutyrophenone, 3,5-di-tert-butyl-4-hydroxytoluene, 3-tert-butyl-4-hydroxyanisole, 2,6-di-tert-butyl-4-hydroxymethylphenol, tocopherol (Vitamin E), 6-hydroxy-2,5,7,8-tetramethylchroman-2-carboxylic acid, 2-mercapto-4 [3H] quinazoline, dodecylmercaptopropionate, thiosalicylic acid, mercaptosuccinic acid, cysteine, 2-mercaptobenzoxazole, salicylaldehyde, 4-hydroxybenzaldehyde and glycol aldehyde diethyl acetal.

The reducing agents of this invention will be employed in the alkaline-containing stripping compositions in an amount effective to reduce or inhibit metal corrosion or metal loss and will generally be within the range of from about 0.1 to about 10% by weight, preferably within from about 0.1 to about 5% by weight, more preferably within from about 0.1 to about 3% by weight and even more preferably within from about 1 to 3% by weight, based upon the total weight of the composition.

The stripping compositions of this invention are effective in stripping a wide and varied range of photoresists especially positive photoresists. Most photoresists consist of an ortho naphthoquinone diazide sulfonic acid ester or amide sensitizer or photoactive component, with novolak, resole, polyacrylamide or acrylic copolymer type binders or resins. Such photoresists are well known in the art. Such resists and sensitizers are described for example, in U.S. Pat. Nos. 3,046,118; 3,046,121; 3,106,465; 3,201,239; 3,538,137; 3,666,473; 3,934,057; 3,984,582 and 4,007,047. As examples of photoresist compositions for which the stripping composition of this invention may be used there may be mentioned: OCG Microelectronics Materials Series CAMP-6, HiPR 6500, HPR500, OCG 825, OCG 895, OCG 897 and OiR 32 photoresists; Hoechst Celanese Series AZ 1500, 6100, 6200B, 7500, 7500T, DX, P4000, and PF 500 photoresists; Shipley Company's Megaposit S1400, S1800, S3800, SPR2, SPR500-A, and SPRT500-A photoresists; Morton Electronic Materials' EL-,NOVA, and OFPR- series photoresists; Toray Industries' EBR-9; and UCB-JSR Electronics' PFR- series photoresists.

The improved properties of stripping compositions of this invention are illustrated in the following example. In the example, the alkaline-containing solvent system stripping compositions to which a reducing agent of this invention has been added are the following compositions A through O:

| Composition | Components (Part by Weight) |
|---|---|
| A | dimethylformamide (90) + 2-aminoethanol (10) |
| B | dimethylacetamide (90) + 2-aminoethanol (10) |
| C | dimethylacetamide (90) + 1-amino-3-propanol (10) |
| D | dimethylacetamide (90) + 1-amino-2-propanol (10) |
| E | dimethylacetamide (60) + 1-amino-2-propanol (10) + sulfolane (30) |
| F | N-methylpyrrolidinone (60) + 1-amino-2-propanol (10) + N-cyclohexylpyrrolidinone (30) |
| G | N-methylpyrrolidinone (70) + 1-amino-2-propanol (30) |
| H | N-methylpyrrolidinone (90) + 2-(2-aminoethylamino)ethanol (10) |
| I | dimethyl sulfoxide (90) + 1-(2-aminoethylpiperazine) |
| J | N-methylpyrrolidinone (80) + 2-(2-aminoethylamino)ethanol (10) + N-(2-hydroxyethyl)pyrrolidinone (10) |
| K | N-methylpyrrolidinone (70) + 2-(2-aminoethylamino)ethanol (10) + triethylene glycol monomethyl ether (20) |
| L | N-methylpyrrolidinone (60) + 2-(2-aminoethylamino)ethanol (10) + diethylene glycol monoethyl ether (30) |
| M | dimethyl sulfoxide (70) + 1-amino-2-propanol (30) |

-continued

| Composition | Components (Part by Weight) |
|---|---|
| N | N-methylpyrrolidinone (50) + 2-(2-aminoethoxy)ethanol (40) + sulfolane (10) |
| O | N-methylpyrrolidinone (60) + 1-amino-2-propanol (10) + sulfolane (30). |

The corrosion rates of the above alkaline-containing stripping composition were measured with and without added reducing agents of this invention and then the percent corrosion inhibition for the stripping compositions of this invention were calculated. The corrosion rates were measured using the three following methods:

METHOD 1: Coupons of 99.9+% tungsten (0.05×12×50 mm) were cleaned in acetone, dried, and weighed. Coupons were heated in one of the above alkaline test compositions (plus 1% water to accentuate corrosion) with and without added reducing agents. After immersion in the test compositions for 4 hours at 85° C., the coupons were removed, rinsed with acetone, dried and reweighed. Weight losses were converted to corrosion rates and finally to percent inhibition for the reducing agent used.

METHOD 2: Identical to Method 1 except that the coupons were of 99.98% copper (0.025×12×50 mm).

METHOD 3: Copper coupons (0.05×10×30 mm) were cleaned in isopropyl alcohol, dried then heated in 10 mL of stripping composition for one hour at 80° C. Copper uptake of the test solution was then measured using atomic absorption spectroscopy and converted to percent inhibition for the reducing agent used.

Corrosion rates for stripping compositions A through O (without a reducing agent of this invention) using methods 1, 2 and 3 are listed below in Angstroms per hour. Results were as follows:

| Composition | Method | Angstrom/hr. Tungsten | Angstrom/hr. Copper |
|---|---|---|---|
| A | 1 | 38 | |
| B | 1 | 120 | |
| C | 1 | 58 | |
| D | 1 | 110 | |
| E | 1 | 100 | |
| F | 2 | | 390 |
| G | 2 | | 450 |
| H | 2 | | 590 |
| I | 2 | | 170 |
| J | 2 | | 260 |
| K | 2 | | 230 |
| L | 2 | | 150 |
| M | 2 | | 730 |
| N | 3 | | 430 |
| O | 3 | | 860 |

Reducing agents of this invention were then included in the aforementioned stripping compositions and subjected to one of the three test methods and corrosion loss measured. The percent inhibition of corrosion loss was then calculated according to the following equation:

$$\text{Percent inhibition} = 100\left(1 - \frac{\text{Corrosion rate with reducing agent}}{\text{Corrosion rate without reducing agent}}\right)$$

EXAMPLE

Inclusion of reducing agents of this invention in the aforedescribed alkaline-containing stripping compositions A through O produced the following inhibition results.

| Test Method | Stripping Composition | Reducing Agent | (% by weight added) | % Inhibition of Metal Loss |
|---|---|---|---|---|
| 1 | A | ascorbic acid | (1) | 100 |
| 1 | B | 2-butyne-1,4-diol | (2) | 79 |
| 1 | B | uric acid | (3) | 94 |
| 1 | B | 1-cyclohexenyl acetone | (5) | 92 |
| 2 | F | ascorbic acid | (2) | 90 |
| 2 | H | ascorbic acid | (2) | 100 |
| 2 | H | 3-nonene-2-one | (10) | 93 |
| 2 | I | ascorbic acid | (2) | 62 |
| 2 | J | ascorbic acid | (2) | 67 |
| 2 | K | ascorbic acid | (2) | 72 |
| 2 | L | ascorbic acid | (2) | 57 |
| 3 | O | ascorbic acid | (.1) | 91 |
| 3 | O | ascorbic acid | (.5) | 98 |
| 3 | O | ascorbic acid | (1) | 97 |
| 3 | N | ascorbic acid | (.1) | 92 |
| 3 | N | ascorbic acid | (1) | 92 |
| 3 | O | *Tetramisole hydrochloride | (1) | 91 |
| 3 | O | *Tetramisole | (1) | 83 |
| 1 | B | p-toluenesulfonyl-hydrazide | (2) | 75 |
| 1 | A | formic hydrazide | (1) | 100 |
| 1 | C | hydrazine | (.5) | 100 |
| 1 | D | hydrazine | (.1) | 64 |
| 1 | D | hydrazine | (2) | 87 |
| 1 | B | maleic hydrazide | (2) | 62 |
| 3 | O | hydrazine hydrate | (1) | 99 |
| 3 | O | hydrazine hydrate | (.1) | 98 |
| 3 | O | hydroxyethyl hydrazine | (1) | 99 |
| 3 | O | phenyl hydrazine | (1) | 98 |
| 3 | O | tert-butyl carbazate | (1) | 97 |
| 3 | O | formic hydrazide | (1) | 96 |
| 3 | O | ethyl carbazate | (1) | 97 |
| 3 | O | p-toluenesulfonyl hydrazide | (1) | 98 |
| 3 | N | hydrazine hydrate | (1) | 96 |
| 1 | B | salicylaldoxime | (5) | 87 |
| 1 | B | acetone oxime | (5) | 78 |
| 1 | B | hydroquinone | (1) | 100 |
| 1 | E | hydroquinone | (1) | 82 |
| 2 | F | pyrogallol | (1) | 63 |
| 2 | G | gallic acid | (3) | 68 |
| 3 | O | hydroquinone | (.1) | 95 |
| 3 | O | hydroquinone | (.5) | 95 |
| 3 | O | hydroquinone | (1) | 96 |
| 3 | N | hydroquinone | (1) | 87 |
| 1 | B | **BHT | (3) | 77 |
| 1 | B | Vitamin E (tocopherol) | (1) | 54 |
| 1 | B | ***Trolox | (1) | 72 |
| 1 | C | 2-mercapto-4[3H] quinazoline | (3) | 86 |
| 1 | D | dodecylmercapto-propionate | (5) | 100 |
| 2 | G | thiosalicylic acid | (3) | 91 |
| 2 | G | mercaptosuccinic acid | (3) | 72 |
| 2 | M | cysteine | (3) | 68 |
| 3 | O | 2-mercapto-4[3H] quinazoline | (1) | 86 |
| 3 | O | 2-mercapto-4[3H] quinazoline | (5) | 89 |
| 3 | O | 2-mercapto-benzoxazole | (5) | 95 |

-continued

| Test Method | Stripping Composition | Reducing Agent (% by weight added) | | % Inhibition of Metal Loss |
|---|---|---|---|---|
| 3 | N | 2-mercapto-4[3H] quinazoline | (1) | 88 |
| 1 | D | salicylaldehyde | (5) | 62 |
| 1 | B | glycol aldehyde diethyl acetal | (5) | 81 |
| 1 | B | 4-hydroxy-benzaldehyde | (5) | 61 |

\*"Tetramisole = 2,3,5,6-tetrahydro-6-phenylimidazo[2,1-b]thiazole.
\*\*"BHT" = 3,5-di-tert-butyl-4-hydroxytoluene.
\*\*\*"Trolox" = 6-hydroxy-2,5,7,8-tetramethylchroman-2-carboxylic acid.

With the foregoing description of the invention, those skilled in the art will appreciate that modifications may be made to the invention without departing from the spirit thereof. Therefore, it is not intended that the scope of the invention be limited to the specific embodiments illustrated and described.

What is claimed is:

1. An alkaline-containing photoresist stripping composition comprising from about 50% to about 98% by weight of the stripping composition of 1-methyl-2-pyrrolidinone, from about 1% to about 50% by weight of the stripping composition of 2-aminoethanol and as a reducing agent from about 0.1% to about 10% by weight of the stripping composition of ascorbic acid to inhibit or reduce metal corrosion when said stripping composition is employed to strip hardened or cross-linked photoresist from a substrate containing metal.

2. An alkaline-containing photoresist stripping composition comprising from about 50% to about 98% by weight of a stripping solvent having a solubility parameter of from about 8 to about 15, from about 1% to about 50% by weight of a nucleophilic amine and an effective amount of ascorbic acid as a reducing agent to inhibit or reduce metal corrosion when said stripping composition is employed to strip hardened or cross-linked photoresist from a substrate containing metal.

* * * * *